United States Patent [19]

Murphy

[11] Patent Number: 5,006,850

[45] Date of Patent: Apr. 9, 1991

[54] FUNCTION TRANSFORMER

[76] Inventor: Gordon J. Murphy, 638 Garden Ct., Glenview, Ill. 60025

[21] Appl. No.: 182,380

[22] Filed: Apr. 18, 1988

[51] Int. Cl.[5] .............. H03M 1/00

[52] U.S. Cl. .............. 341/110; 341/144; 341/155

[58] Field of Search .............. 341/106, 122, 110, 139, 341/141, 142, 144, 155; 381/181, 140, 146, 607; 318/591

[56] References Cited

U.S. PATENT DOCUMENTS

| | | | |
|---|---|---|---|
| 4,027,281 | 5/1977 | Greve et al. | 341/139 |
| 4,141,065 | 2/1979 | Sumi et al. | 318/591 |
| 4,225,936 | 9/1980 | Lesche | 364/718 |
| 4,316,259 | 2/1982 | Albrecht et al. | 364/718 |
| 4,667,302 | 5/1987 | Mackey et al. | 364/718 |

*Primary Examiner*—William M. Shoop, Jr.
*Assistant Examiner*—Brian K. Young

[57] ABSTRACT

A function transformer is disclosed in which apparatus is used to transform an input signal that may be, originally, either in analog or digital form, into an output signal that is a selectable nonlinear function of the input signal, thereby using electronic apparatus where, in previous systems, mechanical apparatus, such as motor-driven cam(s), are usually used for such transformation of input to output.

Although mechanical cams could be used for effecting transformations as disclosed herein, the use of electronic apparatus to effect such transformations, provides for greater flexibility, lower cost, graeter speed of transfomation, and simplicity, where very complex, non-linear, transformations are desired to be effected between data input and data output.

In applications where a potentiometer is to be used to convert an angular displacement of a mechanical rotating shaft to a voltage, and when different variation of output voltage with angular displacement is to be produced, the changing of the taper of the potentiometer can be greatly simplified and the time required to effect the change in taper can be greatly reduced by providing an electronic potentiometer with an easily changeable taper, in the form of a function transformer as disclosed herein.

An apparatus is provided for transforming an analog input signal into an analog output signal that approximates the value of a preselected mathematical function of the analog input signal, by using electronic or electromechanical conversion devices and an electronic data storage device.

19 Claims, 3 Drawing Sheets

FUNCTION TRANSFORMER

I. BACKGROUND OF THE INVENTION

1. Field Of The Invention

The present invention relates to systems in which an output signal is to be produced, which is to be either analog or digital in nature, and which is to be created as a selectable nonlinear function of an input signal that may be either analog or digital in nature. In particular, this invention applies to systems in which electronic means are to be used to transform an input into a desired output signal that is a selectable nonlinear function of the input signal, as opposed to systems in which mechanical means are to be used for said purpose.

Significant advantages offered by this invention are in the speed at which the nonlinear output signal can be changed, and the ease with which the nonlinear function can be changed.

Moreover, in some embodiments of this invention, there exists the capability to change the nonlinear function while the system is in operation, or to change the nonlinear function even though the mechanical portion of the system may be in what would normally be considered to be a hazardous environment.

2. State Of The Art And Background Of This Invention

There are existent in technologies today numerous applications in which: a capability to implement a specific nonlinear relationship between input data (an input signal), supplied in either analog or digital form, and an analog output signal is required; as well as other applications in which a capability to implement a specific nonlinear relationship between input data, in analog form, and a digital output signal is required.

In a number of these applications, a motor may be mechanically coupled to an object in such a way that motion of the moving member of the motor causes motion of said object, and a machine tool is required to cut into the object to a depth that varies in a prescribed manner over the range of displacement, either angular or rectilinear, of said object. In such arrangements, the nonlinear relationship may be implemented by means of one or more mechanical cams moved either directly or indirectly by the motor.

It is, however, frequently difficult, if not impossible, for a human being to change the nonlinear function implemented in the set of mechanical cams after the system has been installed and put into operation. Thus, in radioactive areas or areas of intense heat, and other similar hazard-to-health environments, for example, the surroundings are so dangerous to human life that the presence of a human being to effect a change in the nonlinear relationship is frequently not practical, if it is indeed at all possible.

In yet other applications, it may be difficult for a human being to implement a change in the nonlinear relationship, between input and output, because of the speed at which it is desired that the change be effected. The changing of jobs being performed in an automated manufacturing plant is one example of an application in which such a problem is encountered.

A further consideration is cost. In many applications, the cost of the mechanical cams themselves, and, in particular, the labor cost of changing mechanical cams when a change in the nonlinear relationship between the input data and the output data is desired, is very substantial. An inexpensive means for implementing and changing the input-output relationship is, therefore, to be desired and is provided by this invention.

Still another advantage of this invention is the speed at which the input may be allowed to change. In existing systems, in which an analog signal is sampled periodically, either by its own internal clock or by a digital computer, the maximum rate at which the analog input may change is limited by the sampling rate available. Because the minimum time interval between samples in such systems is of the order of a microsecond or larger (often approximately one hundred microseconds), the maximum allowable rate of change of the analog input is fairly low. The present invention virtually eliminates the foregoing speed-of-change limitation, because no sampling is required if the analog-to-digital conversion is performed, for example, by an optical shaft encoder.

In many applications, a potentiometer may be used to convert an angular displacement of a rotating shaft to a voltage that varies in a desired manner with said angular displacement. When a different variation of voltage with angular displacement is desired, a potentiometer with a different taper must be designed and manufactured. The cost and effort and time delay incurred in making a change in taper can be very greatly reduced by employing the features of this invention, which provides an electronic potentiometer with an easily changeable taper.

II. SUMMARY OF THE INVENTION

In accordance with the present invention, digital electronic memory, such as read-write random access memory (RAM), read-only memory (ROM), programmable read-only memory (PROM), erasable and programmable read-only memory (EPROM), electrically erasable and programmable read-only memory (EEPROM), electrically alterable read-only memory (EAROM), a programmable logic array (PLA), programmable array logic (PAL), random logic, or other similar device, is employed as a storage medium for the information defining the desired nonlinear function between the input signal to the system and the output signal from the system.

If the input signal to the system is digital in nature, said input signal may, itself, be used as an address to access the location in the storage medium in which the associated output information will be stored. If the input signal to the system is analog in nature, said input signal is to be converted to digital form by an appropriate analog-to-digital converter, and the resulting digital signal may then be used as an address to access the location in the storage medium in which the associated output information is stored, even though the input signal itself is a form of data and not an address in the sense commonly understood in the use of memory devices.

In still another mode of operation, in some embodiments of the invention, the address of the location to be accessed in the storage medium is provided instead by a special-purpose computer, hereinafter termed a "programmer", designed to provide a capability to alter the information stored in the storage medium, and hence, to alter the nonlinear function.

If the output signal from the system is digital in nature, in one mode of operation said digital output of the system is simply read out of the storage medium in the customary way, in response to data provided by the input signal to the system, or by the programmer, in the form of the digital word stored at the location in the storage medium corresponding to the input data thereto.

In a further mode of operation, the storage medium is disabled by the programmer, and said digital output of the system is provided by the programmer in response to the analog or digital input to the system, or in response to information provided by the programmer itself.

In any of said modes of operation, if the output signal from the system is analog in nature, said digital word may be converted to analog form by an appropriate digital-to-analog converter, and the resulting analog signal is then used as the output signal of the system.

In still another mode of operation in some embodiments of this invention, the output of the programmer is written into the data storage means by the programmer at a location determined either by the input signal to the system or by the programmer.

Each of the analog-to-digital converter, the storage medium, and the digital-to-analog converter may be separate devices, or two or more of them may be fabricated as a single device. In either case, the device containing the storage medium is of special interest. If said device is hardwired, or consists of random logic, or is otherwise not electrically erasable (such as a ROM or a PROM or a PLA or PAL), then it is to be preferably installed in the system in such a way as to be quickly and easily removable (for example, in a zero-insertion force socket). If said device is electrically erasable (such as RAM, EEPROM, or EAROM), then it may or may not be installed in the system in a similar way, and, in addition, it may, or may not, be provided with customary means for replacing the information stored within it with other information by the programmer without removing said device from the system. The analog input signal to the system may be the degree of angular displacement of a rotating shaft. It will be apparent to one skilled in the art that other forms of analog input signal may also be used.

An important feature of this invention is that, in some embodiments, the system includes, as a separate unit, a programmer that can quickly and simply be electrically and mechanically connected to the remainder of the system, and later be quickly and simply electrically and mechanically disconnected therefrom, for the purpose of substituting temporarily for the storage medium in the operation of the system, while providing to a human operator the capability of altering the nonlinear relationship between the input and the output of the system, stored within the programmer, on a trial basis without altering the content of the first data storage medium.

In a second mode of operation, the selected nonlinear relationship between the input and the output of the system can be transferred from the programmer to said first storage medium.

In a third mode of operation, the programmer is detached from the remainder of the system, and said remainder of the system operates in such a manner as to provide the desired nonlinear functional relationship between the input to the system and the output of the system. A significant advantage of the removability of the programmer is a reduction of cost: thus, a single programmer can be utilized to train and program a large number of operating systems.

A patent search for prior art was conducted. The patents produced by that search are: U.S. Pat. Nos. 4,001,557; 4,225,936; 4,293,917; 4,316,259; 4,370,709; 4,438,502; 4,438,503; 4,482,975; 4,613,952; and 4,667,302. None of the prior art patents disclose the concept that is presented herein. Of those patents located by the search, only U.S. Pat. Nos. 4,225,936; 4,316,259; and 4,667,302 appear to have sufficient relevance to warrant the following discussion presented herein.

In U.S. Pat. No. 4,225,936, a function generator is described, but there is no provision for an arbitrary input to a system. In said patent, an oscillator and an address counter are required to produce a time reference for use as an address input for data storage means; and each entry in the data storage means is a change in value of the function being generated, not the value of the function itself. Furthermore, a bidirectional counter, or other integrating means, is required to be provided to convert the data stored in the data storage means to the absolute value of the function. Furthermore, because the sequencing through the locations in the data storage device is achieved by counting the cycles of the oscillator, the argument of the function is limited to be time itself or a variable directly proportional to time.

In the invention that is disclosed herein, the argument of the nonlinear function can be any analog or digital variable, and it need not be proportional to time. Also, an oscillator and an address counter are not required. Instead, only an analog-to-digital converter may be required to be used.

Moreover, because in this invention the data stored are values of the nonlinear function itself, instead of changes in the value of the nonlinear function, no additional devices, such as a bidirectional counter, or any other integrating means, are required. In addition, this invention provides means for easily selecting any one of a multiplicity of different nonlinear functions, whereas in the prior art U.S. Pat. No. 4,225,936 only a single function is produced. Therefore, the system to be described in this Application: (a) is simpler than the system described in prior art U.S. Pat. No. 4,225,936; (b) provides for easy selection of any one of a multiplicity of analog functions, whereas the system described in U.S. Pat. No. 4,225,936 provides only a single analog function; and (c) provides freedom of choice of an independent variable or argument that is totally lacking in U.S. Pat. No. 4,225,936.

In U.S. Pat. No. 4,316,259, a second function generator is described. A digital logic means that is activated by a clocking means is required. Consequently, the analog functions generated by said disclosure must be functions of time only. In the instant invention, no digital logic means are required, no clocking means are required, and the functions generated may be functions of any selected analog variable, which is not required to be proportional to time. In addition, in U.S. Pat. No. 4,316,259, a microprocessor and/or a host computer is required. In my invention, neither a microprocessor nor a host computer is required. The system described in my invention is far more simple, more compact, and less expensive than the system disclosed and described in U.S. Pat. No. 4,316,259, in addition to providing the additional feature of freedom of choice of an independent variable or argument that is totally lacking in U.S. Pat. No. 4,316,259.

In U.S. Pat. No. 4,667,302, a system is described for the generation of a waveform by means of a complex function generator controller used in conjunction with a temporary waveform function memory, and a complex processor that includes data processing means and a memory in which a plurality of waveform patterns are stored for recall. Digital data for a selected waveform must be transferred to the temporary waveform function memory from the processor. The data are then taken from the temporary waveform function memory by controlling the addressing of said function memory so as to commence said addressing at a first of N sequentially-addressable-locations and to stop addressing said memory at a second subsequent addressable location. Again, as is the fact in U.S. Pat. Nos. 4,225,936 and 4,316,259, as discussed above, the intent in U.S. Pat. No. 4,667,302 is to generate a waveform only as a function of time.

On the other hand, in my invention disclosed herein, no function generator controller is required, nor is a temporary waveform function memory, nor data processing means, required.

A principal objective of my invention is to implement, in a very simple way, a transformation of a variable in real time. The system described in my invention is less complex than the system described in U.S. Pat. No. 4,667,302, and my invention provides more complete freedom in the choice of the independent variable, which mav increase and decrease in value as a function of time, whereas in U.S. Pat. No. 4,667,302 the independent variable is required to increase in value as a function of time.

To summarize, it can be said that what importantly distinguishes my invention that is disclosed herein from U.S. Pat. Nos. discussed above, 4,225,936, 4,316,259, and 4,667,302 collectively is that whereas the purpose of each of those three patents is to provide a waveform generator in which the independent variable is proportional to time, the purpose of my invention is to provide a real-time transformation of a variable that is in no way constrained to be proportional to time. A very significant difference between my invention and the prior art patents discussed above is that where the prior art patents discussed above result in function generators, my invention results in a function transformer. Just as there is a significant difference between an electric generator and an electric transformer, there exists a significant difference between a function generator and a function transformer.

In the system described in this invention, the analog input can be merely a mechanical displacement of a mechanical member. For example, if the analog input to the analog-to-digital conversion means is the rotation of one shaft and the analog output of the digital-to-analog conversion means is coupled response to the analog ouput of the digital-to-analog conversion means, then this system operates as an equivalent of a mechanical cam, with the equivalent of the variable radius of the cam being the data stored in the data storage means. If, in addition, the analog-to-digital conversion means is a shaft encoder or a flash converter, then there is virtually no limitation on the speed of the input shaft, whereas if a digital computer or a microprocessor is used to read the output of the analog-to-digital conversion means, or if other kinds of analog-to-digital conversion means are used, then there exists a significant limitation on the speed of the input shaft. Moreover, the system described in my invention is significantly simpler than any of the three inventions described in the prior art U.S. Pat. Nos. 4,225,936, 4,316, 259, and 4,667,302, regardless of the nature of the analog input.

III. BRIEF DESCRIPTION OF THE DRAWINGS

The above and other advantages and features of the invention will become apparent to those skilled in the art from the following detailed description taken in conjunction with the accompanying drawings, in which:

FIG. 2 is a more detailed diagram of the block identified as

IV. GENERAL DESCRIPTION OF THE SYSTEM

Figure 1:
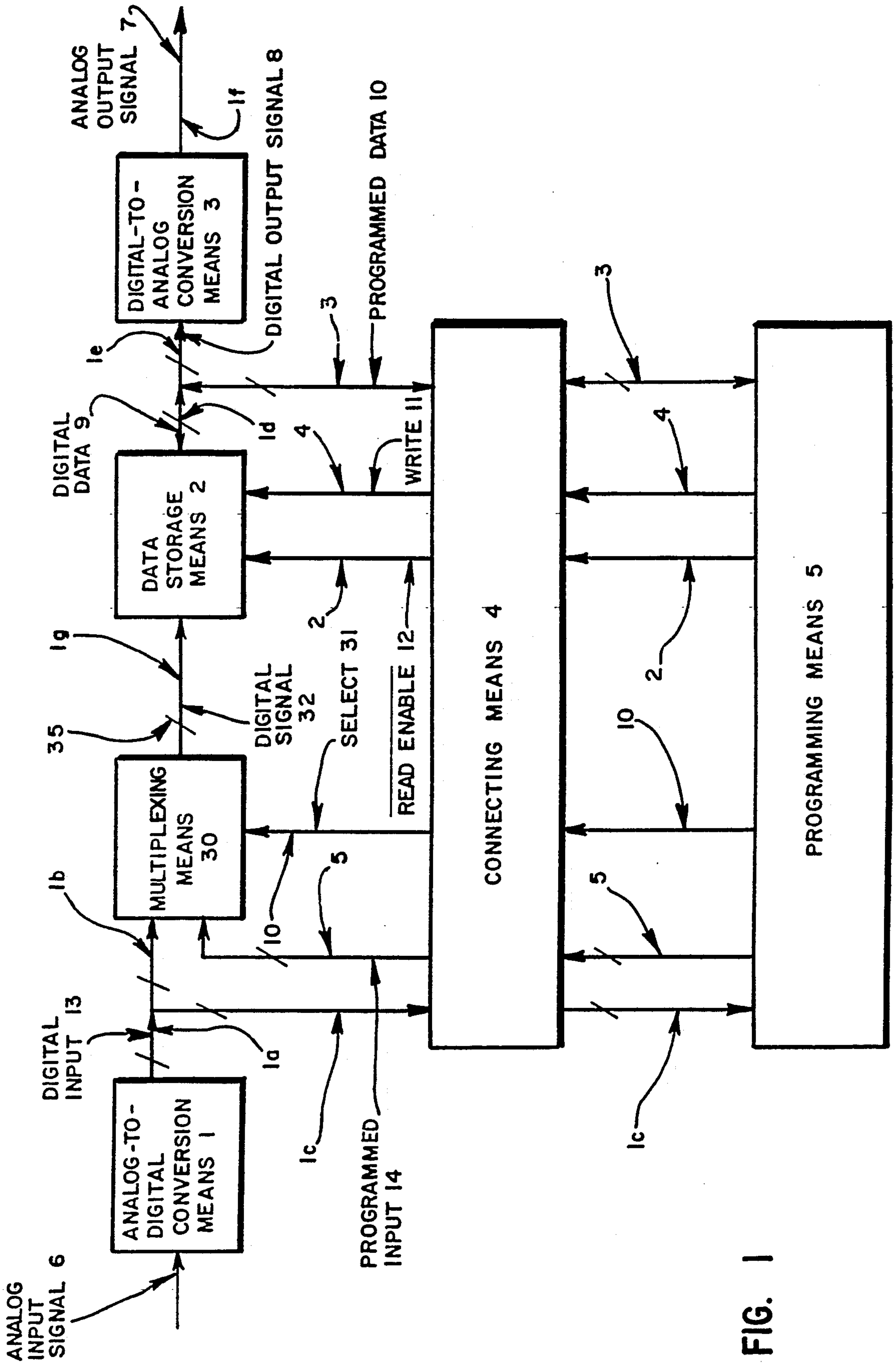
FIG. 1 is a block diagram of one version of my novel function transformer.

With reference to FIG. 1, my novel system, that operates as an function transformer as defined herein, is shown in the form of a block diagram. As is there shown, data storage means 2, which may consist of an electrically erasable, programmable, read-only memory (EEPROM) in one embodiment, is provided. The data storage means 2 are ordinarily enabled and operated in a READ mode. The digital signal 32 that corresponds to the location to be accessed in the data storage means 2 is ordinarily obtained from the analog input signal 6 via multiplexing means 30. Alternatively, the analog-to-digital conversion means 1 may be omitted, and the digital signal 32 corresponding to the location to be accessed in the data storage means 2 may be applied directly on path 1*a*, and then via multiplexing means 30 to the data storage means 2. When programming means 5 are connected to the remainder of the system by connecting means 4, however, the digital signal 32 corresponding to the location to be accessed in the data storage means 2 may be obtained from said programming means via said connecting means and multiplexing means 30.

The output of the system may consist of a digital output signal 8, or it may consist of an analog output signal 7, which is derived from the digital output signal 8 by a known digital-to-analog conversion means 3. The digital output signal 8 ordinarily consists of the digital data 9 that are the output of the data storage means 2. When a programming means 5 is connected to the remainder of the system by a connecting means 4, however, the programmed data output, 10, of the programming means 5 may be substituted for the digital data output, 9, of the data storage means 2, in a manner to be described.

In one mode of operation with programming means 5 connected to the remainder of the system shown in the drawings, by connecting means 4, the programmed data 10 output of the programming means 5, the write 11 output of programming means 5, and the complemented read enable output 12 of programming means 5 are disabled within said programming means. In the said mode of operation, the digital output signal 8 consists of the digital data 9 supplied by the data storage means 2.

In a second mode of operation with the programming means 5 connected to the remainder of the system by connecting means 4, the output of the data storage means 2 is disabled by means of the complemented "read enable" 12 output of the programming means 5, and the programmed data 10 output of the programming means 5 is enabled within said programming means. In said mode of operation, the digital data 9 consist of the programmed data 10 provided by the programming means 5 via connecting means 4, and said digital data are sent out from the system as digital output signal 8 or as analog output signal 7, via digital-to-analog conversion means 3.

In still another mode of operation, with the programming means 5 connected to the remainder of the system by connecting means 4, the output of the data storage means 2 is disabled by means of the complemented read enable 12 output of the programming means 5, and the write 11 signal is made active by the programming means 5, and the programmed data 10 output of the programming means 5 is enabled within said programming means. In said mode of operation, programmed data 10 are transmitted to the remainder of the system via connecting means 4, stored in the data storage means 2, and concurrently sent out from the system as a digital output signal 8, or as an analog output signal 7, via digital-to-analog conversion means 3.

In all of said modes of operation, the digital signal 32 supplied to the data storage means 2 is the digital input 13 or the programmed input 14, depending on the state of a select 31 signal supplied by the programming means 5 via the connecting means 4.

V. DETAILED DESCRIPTION

With reference to FIG. 1, the digital input 13 is shown in its connection to provide digital data to multiplexing means 30, first over path 1*a* and then over path 1*b*, and to programming means 5 via connecting means 4, first over path 1*a* and then over path 1*c*, if said programming means are connected to the remainder of the system. In the event the input signal to the system is an analog input signal 6, said input signal is converted to the digital input 13 by analog-to-digital conversion means 1, which are well known and, therefore, need not be set forth in detail in the present disclosure. Multiplexing means 30 are also well known and need not be described in detail herein.

The digital signal 32 output of the multiplexing means 30 is transmitted over path 1*g* to the data storage means 2, which may be implemented in one of many different forms, including, but not limited to, RAM, ROM, PROM, EPROM, EEPROM, EAROM, PAL, PLA, or random logic, all of which are well known and are not set forth in detail here.

It is to be understood that said data storage means are ordinarily enabled in a well known way that permits disabling the output of said data storage means by an externally applied complemented "read enable" 12.

Moreover, the data storage means 2 will be ordinarily operated in the READ mode, in a well known way that permits the switching of said data storage means into the WRITE mode by the write 11 signal transmitted to said data storage means by the programming means 5 via connecting means 4, with the output of said data storage means disabled by means of the complemented read enable 12 output of said programming means. The digital data 9 at the output of the data storage means 2 are ordinarily transmitted first over path 1*d* and then over path 1*e* as a digital output signal 8. If digital-to-analog conversion means 3 are present, the digital data 9 at the output of the data storage means 2 are transmitted first over path 1*d*, and then over path 1*e*, to the input of said digital-to-analog conversion means, which are well known and not set forth in detail in this disclosure.

In the event that digital-to-analog conversion means 3 are present in the system, the output of said digital-to-analog conversion means is transmitted over path 1*f* as an analog output signal 7 of the system. Thus, the analog or digital output of the system is caused to be a specific nonlinear function of the analog or digital input to the system, and the system operates to transform its input into its output.

When it is desired to establish a nonlinear relationship between the analog input signal 6 or the digital input 13 and the digital output signal 8 or the analog output signal 7, programming means 5 are connected by connecting means 4, which may consist of a well known header and header-socket combination, a well known DIP socket and DIP plug combination, or other similar means. A well known zero-insertion force DIP socket, together with a DIP plug, is a particularly good connecting means because of the ease and speed with which programming means 5 can thus be connected and disconnected and the relatively small amount of mechanical wear on such connecting means.

With the programming means 5 connected by connecting means 4, the output of the data storage means 2 is disabled by the complemented read enable 12 transmitted from the programming means 5 to the data storage means 2 via connecting means 4 on path 2, and the write 11 output of said programming means is made inactive by said programming means. The digital input 13 is transmitted to the programming means 5 via connecting means 4 first over path 1*a* and then over path 1*c*. The analog or digital input to the system is then caused to vary by external means, and for each value of the digital input 13 thus produced at the input to the programming means 5, a corresponding value of programmed data 10 is stored within said programming means in a manner to be described.

Programmed data 10 are transmitted from the programming means 5 to data storage means 2 via connecting means 4, first on path 3 and then on path 1*d*, to the digital output of the system via connecting means 4, first on path 3 and then on path 1*e*, and also first on path 3 and then on path 1*e* to the digital-to-analog conversion means 3, if used, via connecting means 4.

Because the output of the data storage means 2 is disabled and the write 11 output of the programming means 5 is inactive, the data stored in said data storage means are not altered. The effect of the programmed data 10 stored in the programming means 5 can be determined, if desired, by observing the digital output signal 8 or the analog output signal 7 by external means. The programmed data 10 stored in the programming means 5 may be altered repeatedly until a satisfactory relationship between the analog or digital input to the system and the analog or digital output of the system has been established. This is the TRAIN MODE.

As an alternative to training the system in the manner just described, programmed data 10 may be stored in the programming means 5 for each possible value of digital input 13, without requiring that said digital input or the analog input signal 6 be varied, by manual input means provided within the programming means 5.

After a desired relationship between the analog or digital input to the system and the analog or digital output of the system has been established in the programming means 5, the complemented read enable 12 sent to the data storage means 2 via connecting means 4 on path 2 is caused to remain inactive by programming means 5, and an active value of the write 11 signal is transmitted to said data storage means by said programming means on path 4 via connecting means 4. The programmed data 10 stored in the programming means 5 for each possible value of digital input 13 can then be transferred to the data storage means 2 via connecting means 4 first on path 3 and then over path 1*d*. In this process, the digital signal 32 may be caused to vary, by causing the digital input 13 or the analog input signal 6 to vary by external means, with the multiplexing means 30 caused to operate in their normal state by making the select 31 signal sent to said multiplexing means by the programming means 5 via connecting means 4 on path 10 inactive. Alternatively, the digital signal 32 may be caused to vary by causing the programmed input 14 to vary under the control of the programming means 5 with the multiplexing means 30 caused to operate in their second state by making the select 31 signal sent to said multiplexing means by said programming means via connecting means 4 on path 10 active. This is the PROGRAM MODE.

In the train mode and the program mode the digital output signal 8 and the analog output signal 7, if used, will vary in accordance with the programmed data 10, which are transmitted by the programming means 5 via connecting means 4 to the digital output of the system first on path 3 and then over path 1*e*. If such variation of the output of the system is undesirable, it can be eliminated by activating switching means (not shown) that may be interposed in path 1*e* or path 1*f*.

When the data storage means 2 have been programmed as desired, the programming means 5 can be disconnected by connecting means 4 and, if switching means are present in path 1*e* or path 1*f*, said switching means can then be deactivated. As a result, the system is again in its normal operating state or "OPERATE MODE", in which the value of the analog or digital output of the system is determined entirely by the value of the analog input signal 6 or the digital input 13 in accordance with the data stored in the data storage means 2.

Figure 2:
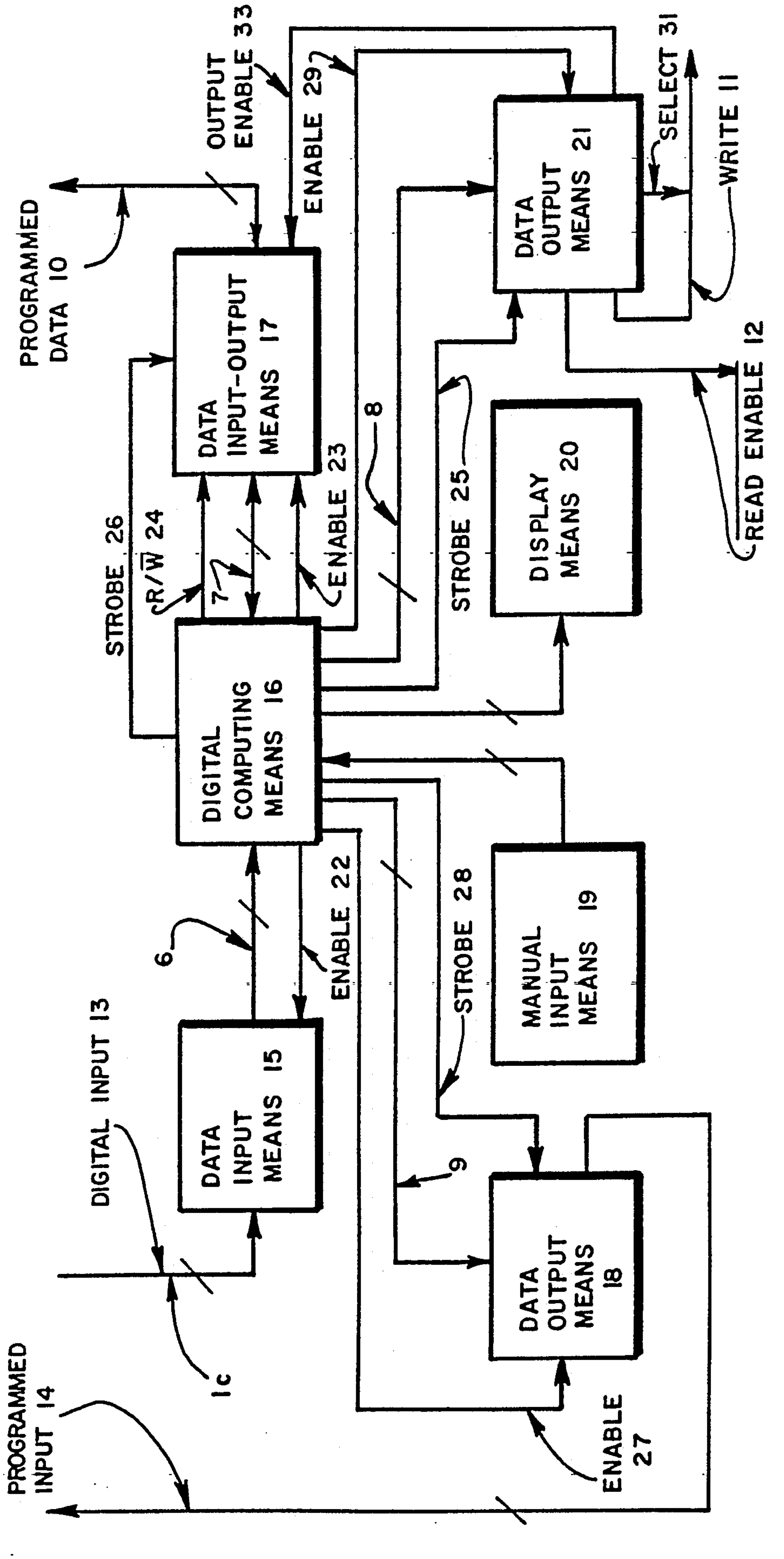

With reference to FIG. 2, the programming means 5 shown in FIG. 1 are described in greater detail. Digital computing means 16 may consist of a microcomputer, comprising an arithmetic/logic unit, timing and decoding circuitry, a control unit, read-only memory, and read-write memory, which are well known, and therefore are not set out in detail in this disclosure. Data input means 15 are provided as an input port, data output means 18 and second data output means 21 are provided as output ports, and data input-output means 17 are provided as a buffered input-output port. The operation of said ports is well known and is not described in detail herein. In addition, manual input means 19 and display means 20 are provided, so as to allow a human operator of the equipment to enter information into the digital computing means 16 and to view information stored within said digital computing means. The operation of the manual input means 19 and the display means 20 is well understood and is not described in detail in the present disclosure.

In one mode of operation with programming means 5 connected to the remainder of the system by connecting means 4, a sequence of values of digital input 13 is stored in the read-write memory contained within the digital computing means 16 in the following manner:

With programming means 5 connected to the remainder of the system by connecting means 4, an inactive value of the write 11 signal and an active value of the complemented read enable 12 signal are transmitted to data output means 21 via the data bus of the digital computing means 16 on path 8 and stored in the output port in said data output means by means of an enable 29 and a strobe 25, under control of a program stored within said digital computing means. The output of the data storage means 2 is disabled by the complemented read enable 12 transmitted from the data output means 21 to the data storage means 2 via connecting means 4 on path 2.

The digital input 13 is transmitted to the data input means 15 via connecting means 4 first on path 1*a* and then on path 1*c*. The analog or digital input to the system is caused to vary over the range of interest by external means, and for different values of the digital input 13 thus produced at the input to the data input means 15, corresponding values of programmed data 10 are stored within said programming means in the following manner.

At appropriate times, under program control, the data input means 15 are enabled by an enable 22, causing the digital input 13 to be transferred to the data bus of the digital computing means 16 on path 6. The digital input 13 is then stored in the read-write memory contained within said digital computing means. Each distinct value of digital input 13 thus transmitted through data input means 15 is stored in a distinct location within said memory, and a corresponding value of programmed data, entered by the operator of the equipment via manual input means 19, is stored in a corresponding distinct location within said memory for each distinct stored value of digital input 13.

Under control of instructions also stored within the digital computing means 16, data input-output means 17 are enabled by an enable 23, and the programmed data, corresponding to each distinct value of the digital input 13, are transmitted to the output port in data input-output means 17 on path 7 and stored there by means of a R/W 24 signal and a strobe 26 The programmed data 10 are transmitted from the data input-output means 17 to the data storage means 2 via connecting means 4 first on path 3 and then along path 1d, and to the digital output 8 of the system, first on path 3 and then on path 1*e*.

Because the write 11 signal is inactive, the data stored in said data storage means are not altered The effect of the programmed data 10 stored in the digital computing means 16 can be determined, if desired, by observing the digital output signal 8 or the analog output signal 7 by external means The programmed data 10 stored in the digital computing means 16 can be altered repeatedly by repetition of the process just described until a satisfactory relationship between the analog or digital input to the system and the analog or digital output of the system has been established, thus training the system.

In an alternative training mode of operation with programming means 5 connected to the remainder of the system by connecting means 4, manual input means 19 and display means 20 are used by the operator of the equipment in a conventional manner to enter a sequence of values of digital input 13 and corresponding values of programmed data into the read-write memory contained within the digital computing means 16, without using the analog or digital input to the system to provide values of the digital input 13. In this mode, also, the output of the data storage means 2 is disabled by the complemented read enable 12 signal transmitted from data output means 21 on path 2, the write 11 signal is inactive, and the programmed data 10 are transmitted from the data input-output means 17 to the data storage means 2 via connecting means 4 first on path 3 and then over path 1d and to the digital output 8 of the system via connecting means 4 first on path 3 and then over path 1e. Because the write 11 signal is inactive, the data stored in said data storage means are not altered.

After the system has been trained, as described, the data storage means 2 are programmed, in the following manner. Under control of a program stored in digital computing means 16, an inactive value of the complemented "read enable" 12 signal and an active value of the select 31 signal are transmitted to data output means 21 on the data bus of the digital computing means 16 on path 8 and stored in the output port of said data output means by means of an enable 29 and a strobe 25. Then, the desired relationship between the input to the system and the output of the system, which was stored in memory within the digital computing means 16 during the training operation as described, is transferred to the data storage means 2 as follows for every possible value of digital input 13. A value of programmed input 14 is transmitted from the digital computing means 16 to data output means 18 on the data bus of said digital computing means on path 9 and stored in the output port in said data output means by means of an enable 27 and a strobe 28.

The value of the programmed input 14 is transmitted from said data output means to the multiplexing means 30 via connecting means 4 on path 5 and from said multiplexing means to the data storage means 2 on path 1b. The value of programmed data corresponding to said value of programmed input is transmitted from the digital computing means 16 to the data input-output means 17 on the data bus of said digital computing means via path 7 and stored in the output port in said data input-output means by means of an enable 23, the R/$\overline{W}$24 signal, and a strobe 26. The programmed data 10 are transmitted from the data input-output means 17 to the data storage means 2 via connecting means 4 first on path 3 and then over path 1d, and to the digital output signal 8 and the analog-to-digital conversion means 3, if used, first on path 3 and then on path 1e. An active value of the write 11 signal is transmited from the digital computing means 16 to data output means 21 on the data bus of said digital computing means on path 8 and stored in the output port in said data output means by means of an enable 29 and a strobe 25. The write 11 signal is transmitted from data output means 21 to the data storage means 2 via connecting means 4 on path 4, causing the present value of programmed data 10 to be stored in said data storage means at the present value of the programmed input 14. Then an inactive value of the write 11 signal is transmitted to said data storage means and stored in the output port contained therein in the manner just described for storing the active value of said write signal. The process is repeated for every remaining possible value of the digital input 13, thus completing the programming of the system.

In the course of programming the data storage means 2, the data stored in said data storage means can be verified, if desired, by the following procedure. With an inactive value of the complemented read enable 12 sent to the data storage means 2 by the programming means 5 via connecting means 4 on path 2, and an inactive value of the write 11 signal sent to the data storage means 2 by the programming means 5 via connecting means 4 on path 4, and an inactive value of the output enable 33 sent to the data input-output means 17 by data output means 21, the value of digital data (as stored in the data storage means 2 corresponding to the current value of the digital signal 32, which appears at the output of said data storage means as the digital data 9 output of said data storage means) is transmitted through the data input-output means 17 to the data bus of the digital computing means 16 on path 7 under program control. Then, the value of digital data on the data bus is transferred into an internal register of the digital computing means 16 in the customary manner and compared with the value of digital data desired to be stored in the data storage means 2 in correspondence with the current value of the digital signal 32.

After the system has been trained and programmed, as described, the programming means 5 can be disconnected from the remainder of the system by use of connecting means 4. The function transformer then operates in its normal mode, as described previously with reference to FIG. 1 alone.

Figure 3:
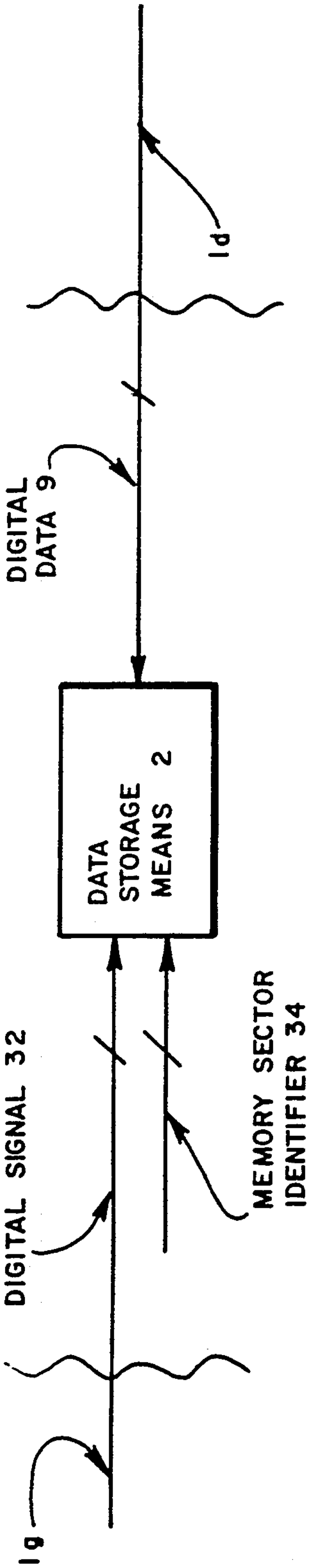
FIG. 3 is a diagram of an improvement in the method of identifying the location that is to be accessed within the data storage means illustrated in FIG. 1.

In an improved implementation of the system, illustrated in FIG. 3 in conjunction with FIG. 1, the digital signal 32 at the input to the data storage means 2 is augmented by a memory sector identifier 34. Said memory sector identifier consists of one or more additional bits of data, designed for use in conjunction with the digital signal 32, in identifying the storage location within data storage means 2 to be accessed. The means by which the memory sector identifier is supplied are not shown, because said means, which may be a manually operable selector switch, are not a part of this invention. By changing the memory sector identifier 34, the functional relationship between the analog input signal 6 or the digital input 13 and the analog output signal 7 or the digital output signal 8 (e.g., the profile of an electronic cam) can be changed with simplicity, if the proper data are stored in different blocks or sectors within the data storage means 2, as will be evident to one skilled in the art.

Figure 4:
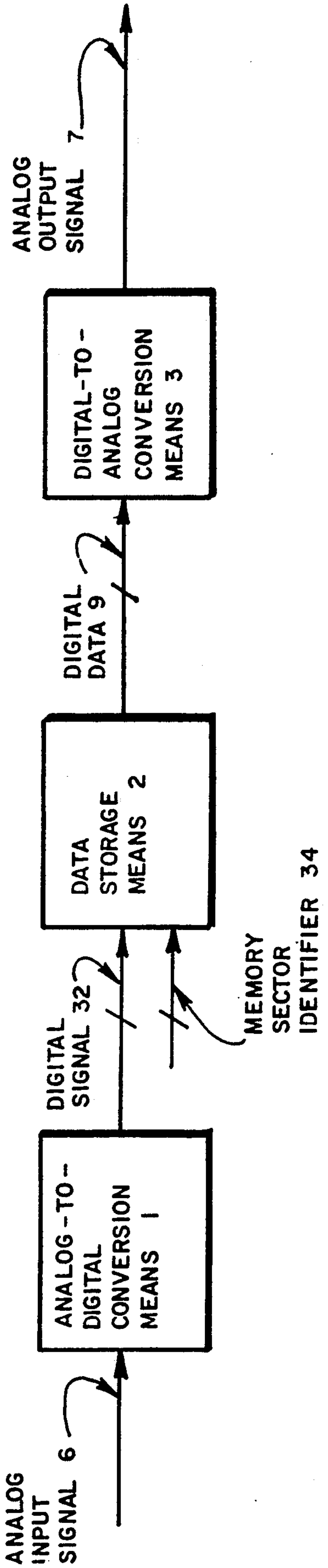
FIG. 4 is a diagram of a basic function transformer that does not utilize a programmer.

It will also now be understood by one skilled in the art that the multiplexer is not required in a basic function transformer as taught in this invention. Data may be stored in the data storage means 2 in any manner whatever, without use of the programming means 5. The data storage means 2 may then be connected to the analog-to-digital conversion means 1 and the digital-to-analog conversion means 3, as shown in FIG. 4, or merely to the analog-to-digital conversion means 1 alone, or merely to the digital-to-analog conversion means 3 alone, or to neither the analog-to-digital conversion means 1 nor the digital-to-analog conversion means 3, and used to implement a transformation of input data into output data.

In addition, it will be evident to one skilled in the art that the training of the system can be effected by storing data directly in the data storage means 2 by use of the programming means 5 connected to the remainder of the system by connecting means 4, without first storing the data in memory in the digital computing means 16.

Another implementation of this invention that will be evident to one skilled in the art is the disclosure of a system in which the memory in the digital computing means 16 in which the programmed data are to be stored is connected via the connecting means 4 to the digital signal 32 in the same manner as the data storage means 2 are connected to said digital signal, instead of by means of an input port as described previously.

Although the invention herein disclosed has been described with respect to specific embodiments, various modifications and improvements will occur to those skilled in the art. It is to be understood, therefore, that this invention is not limited to the particular form shown, nor to specific devices known at present, but includes all arrangements of apparatus that do not depart from the spirit and scope of the appended claims and specific devices developed in the future.

What is claimed is:

1. Apparatus for transforming an analog input signal into an analog output signal that approximates the value of a predetermined mathematical function of said analog input signal comprising:

(a) analog-to-digital conversion means having an input connected to receive the analog input signal and an output for providing an approximation to said analog input signal in the form of a digital code;

(b) data storage means having stored therein a plurality of precalculated digital values of the predetermined mathematical function of said analog input signal to said analog-to-digital conversion means, said data storage means having an input on address lines connected to receive as a digital input signal at least a portion of said digital signal provided at said output of said analog-to-digital conversion means and an output on data lines, for providing at the output thereof an output signal that is at least a portion of an appropriate one of the stored precalculated digital values in response to the input of said digital input signal, and (c) digital-to-analog conversion means having an input connected to receive as a digital input signal at least a portion of said digital signal provided at said output of said data storage means and an output, for providing at the output thereof an analog output signal that corresponds to said digital input signal thereto.

2. Apparatus for transforming an analog input signal into an analog output signal that approximates the value of a predetermined mathematical function of said analog input signal comprising:

(a) analog-to-digital conversion means having an input connected to receive the analog input signal and an output for providing an approximation to said analog input signal in the form of a digital code;

(b) data storage means having stored therein a plurality of precalculated digital values of the predetermined mathematical function of said analog input signal to said analog-to-digital conversion means, said data storage means having an input on address lines connected to receive as a digital input signal at least a portion of said digital signal provided at said output of said analog-to-digital conversion means and additional digital input information, and an output on data lines, for providing at the output thereof an output signal that is at least a portion of an appropriate one of the stored precalculated digital values in response to the input of said digital input signal, and (c) digital-to-analog conversion means having an input connected to receive as a digital input signal at least a portion of said digital signal provided at said output of said data storage means and an output, for providing at the output thereof an analog output signal that corresponds to said digital input signal thereto.

3. Apparatus for transforming an analog input signal into an analog output signal that approximates the value of a predetermined mathematical function of said analog input signal comprising:

(a) analog-to-digital conversion means having an input connected to receive the analog input signal and an output for providing an approximation to said analog input signal in the form of a digital code;

(b) multiplexing means having one input connected to receive as one digital input signal at least a portion of the digital signal at the output of the analog-to-digital conversion means and one or more additional inputs connected to receive additional digital input signals, an additional input connected to receive a control signal for selection of one of the several digital input signals, and an output for providing a selected one of the several digital input signals thereto;

(c) data storage means having stored therein a plurality of precalculated digital values of the predetermined mathematical function of said analog input signal to the analog-to-digital conversion means, said data storage means having an input on address lines connected to receive as a digital input signal at least a portion of said digital signal provided at said output of said multiplexing means and an output on data lines, for providing at the output thereof an output signal that is at least a portion of an appropriate one of the stored precalculated digital values in response to the input of said digital input signal, and (d) digital-to-analog conversion means having an input connected to receive as a digital input signal at least a portion of said digital signal provided at said output of said data storage means and an output, for providing at the output thereof an analog output signal that corresponds to said digital input signal thereto.

4. Apparatus for transforming an analog input signal into a digital output signal that approximates the value of a predetermined mathematical function of said analog input signal comprising:

(a) analog-to-digital conversion means having an input connected to receive the analog input signal and an output for providing an approximation to said analog input signal in the form of a digital code, and (b) data storage means having stored therein a plurality of precalculated digital values of the predetermined mathematical function of said analog input signal to said analog-to-digital conversion means, said data storage means having an input on address lines connected to receive as a digital input signal at least a portion of said digital signal provided at said output of said analog-to-digital conversion means and an output on data lines, for providing at the output thereof an output signal that is at least a portion of an appropriate one of the stored precalculated digital values in response to the input of said digital input signal.

5. Apparatus for transforming an analog input signal into a digital output signal that approximates the value of a predetermined mathematical function of said analog input signal comprising:

(a) analog-to-digital conversion means having an input connected to receive the analog input signal and an output for providing an approximation to said analog input signal in the form of a digital code, and (b) data storage means having stored therein a plurality of precalculated digital values of the predetermined mathematical function of said analog input signal to said analog-to-digital conversion means, said data storage means having an input on address lines connected to receive as a digital input signal at least a portion of said digital signal provided at said output of the analog-to-digital conversion means and additional digital input information, and an output on data lines, for providing at the output thereof an output signal that is at least a portion of an appropriate one of the stored precalculated digital values in response to the input of said digital input signal.

6. Apparatus for transforming an analog input signal into a digital output signal that approximates the value of a predetermined mathematical function of said analog input signal comprising:

(a) analog-to-digital conversion means having an input connected to receive the analog input signal and an output for providing an approximation to said analog input signal in the form of a digital code;

(b) multiplexing means having one input connected to receive as one digital input signal at least a portion of the digital signal at the output of the analog-to-digital conversion means and one or more additional inputs connected to receive additional digital input signals, an additional input connected to receive a control signal for selection of one of the several digital input signals, and an output for providing a selected one of the several digital input signals thereto, and (c) data storage means having stored therein a plurality of precalculated digital values of the predetermined mathematical function of said analog input signal to said analog-to-digital conversion means, said data storage means having an input on address lines connected to receive as a digital input signal at least a portion of said digital signal provided at said output of said multiplexing means and an output on data lines, for providing at the output thereof an output signal that is at least a portion of an appropriate one of the stored precalculated digital values in response to the input of said digital input signal.

7. Apparatus for transforming a digital input signal into an analog output signal that approximates the value of a predetermined mathematical function of said digital input signal comprising:

(a) data storage means having stored therein a plurality of precalculated digital values of the predetermined mathematical function of said digital input signal, said data storage means having an output, for providing at the output thereof on data lines an output signal that is at least a portion of an appropriate one of the stored precalculated digital values in response to the input of said digital input signal on address lines, and (b) digital-to-analog conversion means having an input connected to receive as a digital input signal at least a portion of said digital signal provided at said output of said data storage means and an output, for providing at the output thereof an analog output signal that corresponds to said digital input signal thereto.

8. Apparatus for transforming an analog input signal into an analog output signal that approximates the value of a Predetermined mathematical function of said analog input signal comprising:

(a) analog-to-digital conversion means having an input connected to receive the analog input signal and an output for providing an approximation to said analog input signal in the form of a digital code;

(b) multiplexing means having one input connected to receive as one digital input signal at least a portion of the digital signal provided at said output of said analog-to-digital conversion means and one or more additional inputs connected to receive additional digital input signals, an additional input connected to receive a control signal for selection of one of the several digital input signals, and an output for providing a selected one of the several digital input signals thereto;

(c) data storage means having stored therein a plurality of precalculated digital values of the predetermined mathematical function of said analog input signal to said analog-to-digital conversion means, said data storage means having an input on address lines connected to receive as a digital input signal at least a portion of said digital signal provided at said output of said multiplexing means, a data input-output connection on data lines for providing at the output thereof an output signal that is at least a portion of an appropriate one of the stored precalculated digital values in response to the input of said digital input signal and for providing transmission of digital data into said data storage means for storage therein at a location determined by said digital input signal at said input, a read enable input for enabling the output of digital data on said data input-output connection, and a write control input for enabling the writing of data into said data storage means on said data input-output connection;

(d) digital-to-analog conversion means having an input connected to receive as a digital input signal at least a portion of the digital signal at said data input-output connection of said data storage means, and an output, for providing at the output thereof an analog output signal that corresponds to said digital input signal thereto;

(e) manual input means having an output for providing a digital output signal in response to the manual input thereto;

(f) digital computing means having an input connected to receive at least a portion of said digital output of said manual input means, a first data output for providing stored digital data and control information for a display, a data input-output connection for providing stored digital data to data input-output means, a first enable output for enabling said data input-output means, a read-write control output for determining the direction of data transfer between said digital computing means and said data input-output means, a first strobe output for providing transfer of digital data at said data input-output connection to said data input-output means, a third data output for providing stored digital data to first data output means, a second enable output for enabling said first data output means, a second strobe output for providing transfer of digital data at said third data output to said first data output means, a fourth data output for providing stored digital data to second data output means, a third enable output for enabling said second data output means, a third strobe output for providing transfer of digital data at said fourth data output to said second data output means, a data input connected to receive at least a part of the data at the output of data input means, and an enable output for enabling said data input means;

(g) display means having an input connected to receive the digital data and control information at the first data output of said digital computing means and operable to display said digital data provided at said input to said display means;

(h) data input-output means having a first data input-output connection for providing data transfer between said data input-output connection of said digital computing means and said data input-output means, a second data input-output connection for providing data transfer to and from said data input-output means, an enable input connected to receive said first enable output of said digital computing means, a read-write control input connected to receive said read-write control output of said digital computing means, a strobe input connected to receive said first strobe output of said digital computing means, and an output enable input connected to receive a control signal provided at the output enable output of said second data output means;

(i) first data output means having a data input connected to receive data at said third data output of said digital computing means, an enable input connected to receive said second enable output of said digital computing means, a strobe input connected to receive said second strobe output of said digital computing means, and a data output for providing data transfer from said first data output means;

(j) second data output means having a data input connected to receive data at said fourth data output of said digital computing means, an enable input connected to receive said third enable output of said digital computing means, a strobe input connected to receive said third strobe output of said digital computing means, a read enable output for providing a read control signal in response to said data input to said second data output means, a write output for providing a write control signal in response to said data input to said second data output means, a select output for providing selection of one among several data sources in response to said data input to said second data output means, and an output enable output for providing a control signal to enable the output of said data input-output means;

(k) data input means having a data input for receiving input data, an output for providing data in response to the data input thereto, and an enable input for enabling said output, and (l) connecting means for connecting said output of said analog-to-digital conversion means to said data input to said data input means, for connecting said data output of said first data output means to one of said additional inputs to said multiplexing means, for connecting said second data input-output connection of said data input-output means to said data input-output connection of said data storage means, for connecting said select output of said second data output means to said additional input to said multiplexing means, for connecting said read enable output of said second data output means to said read enable input to said data storage means, and for connecting said write output of said second data output means to said write control input to said data storage means.

9. Apparatus for transforming a digital input signal into an analog output signal that approximates the value of a predetermined mathematical function of said digital input signal comprising:

(a) multiplexing means having one input connected to receive as one digital input signal at least a portion of said digital input signal, one or more additional inputs connected to receive additional digital input signals, an additional input connected to receive a control signal for selection of one of the several digital input signals, and an output for providing a selected one of the several digital input signals thereto;

(b) data storage means having stored therein a plurality of precalculated digital values of the predetermined mathematical function of said digital input signal to said multiplexing means said data storage means having an input on address lines connected to receive as a digital input signal at least a portion of said digital signal at said output of said multiplexing means, a data input-output connection on data lines for providing at the output thereof an output signal that is at least a portion of an appropriate one of the stored precalculated digital values in response to the input of said digital input signal and for providing transmission of digital data into said data storage means for storage therein at a location determined by said digital input signal at said input, a read enable input for enabling the output of digital data on said data input-output connection, and a write control input for enabling the writing of data into said data storage means on said data input-output connection;

(c) digital-to-analog conversion means having an input connected to receive as a digital input signal at least a portion of the digital signal at said data input-output connection of said data storage means, and an output, for providing at the output thereof an analog output signal that corresponds to said digital input signal thereto;

(d) manual input means having an output for providing a digital output signal in response to the manual input thereto;

(e) digital computing means having an input connected to receive at least part of said digital output of said manual input means, a first data output for providing stored digital data and control information for a display, a data input-output connection for providing stored digital data to data input-output means, a first enable output for enabling said data input-output means, a read-write control output for determining the direction of data transfer between said digital computing means and said data input-output means, a first strobe output for providing transfer of digital data at said data input-output connection to said data input-output means, a third data output for providing stored digital data to first data output means, a second enable output for enabling said first data output means, a second strobe output for providing transfer of digital data at said third data output to said first data output means, a fourth data output for providing stored digital data to second data output means, a third enable output for enabling said second data output means, a third strobe output for providing transfer of digital data at said fourth data output to said second data output means, a data input connected to receive at least a part of the data at the output of data input means, and an enable output for enabling said data input means;

(f) display means having an input connected to receive said digital data and control information at said first data output of said digital computing means and operable to display said digital data provided at said input to said display means;

(g) data input-output means having a first data input-output connection for providing data transfer between said data input-output connection of said digital computing means and said data input-output means, a second data input-output connection for providing data transfer to and from said data input-output means, an enable input connected to receive said first enable output of said digital computing means, a read-write control input connected to receive said read-write control output of said digital computing means, a strobe input connected to receive said first strobe output of said digital computing means, and an output enable input connected to receive a control signal provided at the output enable output of said second data output means;

(h) first data output means having a data input connected to receive data provided at said third data output of said digital computing means, an enable input connected to receive said second enable output of said digital computing means, a strobe input connected to receive said second strobe output of said digital computing means, and a data output for providing data transfer from said first data output means;

(i) second data output means having a data input connected to receive data at said fourth data output of said digital computing means, an enable input connected to receive said third enable output of said digital computing means, a strobe input connected to receive said third strobe output of said digital computing means, a read enable output for providing a read control signal in response to said data input to said second data output means, a write output for providing a write control signal in response to said data input to said second data output means, a select output for providing selection of one among several data sources in response to said data input to said second data output means, and an output enable output for providing a control signal to enable the output of said data input-output means;

(j) data input means having a data input for receiving input data, an output for providing data in response to the data input thereto, and an enable input for enabling said output, and signal to said data input to said data input means, for connecting said data output of said first data output means to one of said additional inputs to said multiplexing means, for connecting said second data input-output connection of said data input-output means to said data input-output connection of said data storage means, for connecting said select output of said second data output means to said additional input to said multiplexing means, for connecting said read enable output of said second data output means to said read enable input to said data storage means, and for connecting said write output of said second data output means to said write control input to said data storage means.

10. Apparatus for transforming a digital input signal into a digital output signal that approximates the value of a predetermined mathematical function of said digital input signal comprising:

(a) multiplexing means having one input connected to receive as one input signal at least a portion of said digital input signal, one or more additional inputs connected to receive additional digital input signals, an additional input connected to receive a control signal for selection of one of the several digital input signals, and an output for providing a selected one of the several digital input signals thereto;

(b) data storage means having stored therein a plurality of precalculated digital values of the predetermined mathematical function of said digital input signal to said multiplexing means, said data storage means having an input on address lines connected to receive as a digital input signal at least a portion of the digital signal at the output of said multiplexing means, a data input-output connection for providing at the output thereof an output signal that is at least a portion of an appropriate one of the stored precalculated digital values in response to the input of said digital input signal and for providing transmission of digital data into said data storage means for storage therein at a location determined by the digital input signal at said input, a read enable input for enabling the output of digital data on said data input-output connection, a write control input for enabling the writing of data into said data storage means on said data input-output connection;

(c) manual input means having an output for providing a digital output signal in response to the manual input thereto;

(d) digital computing means having an input connected to receive at least part of said digital output of said manual input means, a first data output for providing stored digital data and control information for a display, a data input-output connection for providing stored digital data to data input-output means, a first enable output for enabling said data input-output means, a read-write control output for determining the direction of data transfer between said digital computing means and said data input-output means, a first strobe output for providing transfer of digital data at said data input-output connection to said data input-output means, a third data output for providing stored digital data to first data output means, a second enable output for enabling said first data output means, a second strobe output for providing transfer of digital data at said third data output to said first data output means, a fourth data output for providing stored digital data to second data output means, a third enable output for enabling said second data output means, a third strobe output for providing transfer of digital data at said fourth data output to said second data output means, a data input connected to receive at least a part of the data at the output of data input means, and an enable output for enabling said data input means;

(e) display means having an input connected to receive said digital data and control information provided at said first data output of said digital computing means and operable to display said digital data provided at said input to said display means;

(f) data input-output means having a first data input-output connection for providing data transfer between said data input-output connection of said digital computing means and said data input-output means, a second data input-output connection for providing data transfer to and from said data input-output means, an enable input connected to receive said first enable output of said digital computing means, a read-write control input connected to receive said read-write control output of said digital computing means, a strobe input connected to receive said first strobe output of said digital computing means, and an output enable input connected to receive a control signal provided at the output enable output of said second data output means;

(g) first data output means having a data input connected to receive data provided at said third data output of said digital computing means, an enable input connected to receive said second enable output of said digital computing means, a strobe input connected to receive said second strobe output of said digital computing means, and a data output for providing data transfer from said first data output means;

(h) second data output means having a data input connected to receive data at said fourth data output of said digital computing means, an enable input connected to receive said third enable output of said digital computing means, a strobe input connected to receive said third strobe output of said digital computing means, a read enable output for providing a read control signal in response to said data input to said second data output means, a write output for providing a write control signal in response to said data input to said second data output means, a select output for providing selection of one among several data sources in response to said data input to said second data output means, and an output enable output for providing a control signal to enable the output of said data input-output means;

(i) data input means having a data input for receiving input data, an output for providing data in response to the data input thereto, and an enable input for enabling said output, and (j) connecting means for connecting said digital input signal to said data input to said data input means, for connecting said data output of said first data output means to one of said additional inputs to said multiplexing means, for connecting said second data input-output connection of said data input-output means to said data input-output connection of said data storage means, for connecting said select output of said second data output means to said additional input to said multiplexing means, for connecting said read enable output of said second data output means to said read enable input to said data storage means, and for connecting said write output of said second data output means to said write control input to said data storage means.

11. Apparatus for transforming an analog input signal into a digital output signal that approximates the value of a predetermined mathematical function of said analog input signal comprising:

(a) analog-to-digital conversion means having an input connected to receive the analog input signal and an output for providing an approximation to said analog input signal in the form of a digital code;

(b) multiplexing means having one input connected to receive as one digital input signal at least a portion of the digital signal at the output of the analog-to-digital conversion means and one or more additional inputs connected to receive additional digital input signals, an additional input connected to receive a control signal for selection of one of the several digital input signals, and an output for providing a selected one of the several digital input signals thereto;

(c) data storage means having stored therein a plurality of precalculated digital values of the predetermined mathematical function of the analog input signal to the analog-to-digital conversion means, said data storage means having an input on address lines connected to receive as a digital input signal at least a portion of the digital signal at said output of said multiplexing means, a data input-output connection on data lines for providing at the output thereof an output signal that is at least a portion of an appropriate one of the stored precalculated digital values in response to the input of said digital input signal and for providing transmission of digital data into said data storage means for storage therein at a location determined by the digital input signal at said input, a read enable input for enabling the output of digital data on said data input-output connection, a write control input for enabling the writing of data into said data storage means on said data input-output connection;

(d) manual input means having an output for providing a digital output signal in response to the manual input thereto;

(e) digital computing means having an input connected to receive at least part of said digital output of said manual input means, a first data output for providing stored digital data and control information for a display, a data input-output connection for providing stored digital data to data input-output means, a first enable output for enabling said data input-output means, a read-write control output for determining the direction of data transfer between said digital computing means and said data input-output means, a first strobe output for providing transfer of digital data at said data input-output connection to said data input-output means, a third data output for providing stored digital data to first data output means, a second enable output for enabling said first data output means, a second strobe output for providing transfer of digital data at said third data output to said first data output means, a fourth data output for providing stored digital data to second data output means, a third enable output for enabling said second data output means, a third strobe output for providing transfer of digital data at said fourth data output to said second data output means, a data input connected to receive at least a part of the data at the output of data input means, and an enable output for enabling said data input means;

(f) display means having an input connected to receive said digital data and control information at said first data output of said digital computing means and operable to display said digital data provided at said input to said display means;

(g) data input-output means having a first data input-output connection for providing data transfer between said data input-output connection of said digital computing means and said data input-output means, a second data input-output connection for providing data transfer to and from said data input-output means, an enable input connected to receive said first enable output of said digital computing means, a read-write control input connected to receive said read-write control output of said digital computing means, a strobe input connected to receive said first strobe output of said digital computing means, and an output enable input connected to receive a control signal provided at the output enable output of said second data output means;

(h) first data output means having a data input connected to receive data provided at said third data output of said digital computing means, an enable input connected to receive said second enable output of said digital computing means, a strobe input connected to receive said second strobe output of said digital computing means, and a data output for providing data transfer from said first data output means;

(i) second data output means having a data input connected to receive data at said fourth data output of said digital computing means, an enable input connected to receive said third enable output of said digital computing means, a strobe input connected to receive said third strobe output of said digital computing means, a read enable output for providing a read control signal in response to said data input to said second data output means, a write output for providing a write control signal in response to said data input to said second data output means, a select output for providing selection of one among several data sources in response to said data input to said second data output means, and an output enable output for providing a control signal to enable the output of said data input-output means;

(j) data input means having a data input for receiving input data, an output for providing data in response to the data input thereto, and an enable input for enabling said output, and (k) connecting means for connecting said output of said analog-to-digital conversion means to said data input to said data input means, for connecting said data output of said first data output means to one of said additional inputs to said multiplexing means, for connecting said second data input-output connection of said data input-output means to said data input-output connection of said data storage means, for connecting said select output of said second data output means to said additional input to said multiplexing means, for connecting said read enable output of said second data output means to said read enable input to said data storage means, and for connecting said write output of said second data output means to said write control input to said data storage means.

12. A system as claimed in claim 1 with the addition of an output converter comprising:

(a) amplifying means with an input connected to receive as an input signal the analog output of the digital-to-analog converter, and an output for providing an amplified copy of said input signal as an input to electromechanical conversion means, and (b) electromechanical conversion means with an input connected to receive said output of said amplifying means, and an output for providing mechanical displacement.

13. A system as claimed in claim 2 with the addition of an output converter comprising:

(a) amplifying means with an input connected to receive as an input signal the analog output of the digital-to-analog converter, and an output for providing an amplified copy of said input signal as an input to electromechanical conversion means, and (b) electromechanical conversion means with an input connected to receive said output of said amplifying means, and an output for providing mechanical displacement.

14. A system as claimed in claim 3 with the addition of an output converter comprising:

(a) amplifying means with an input connected to receive as an input signal the analog output of the digital-to-analog converter, and an output for providing an amplified copy of said input signal as an input to electromechanical conversion means, and (b) electromechanical conversion means with an input connected to receive said output of said amplifying means, and an output for providing mechanical displacement.

15. A system as claimed in claim 7 with the addition of an output converter comprising:

(a) amplifying means with an input connected to receive as an input signal the analog output of the digital-to-analog converter, and an output for providing an amplified copy of said input signal as an input to electromechanical conversion means, and (b) electromechanical conversion means with an input connected to receive said output of said amplifying means, and an output for providing mechanical displacement.

16. A system as claimed in claim 8 with the addition of an output converter comprising:

(a) amplifying means with an input connected to receive as an input signal the analog output of the digital-to-analog converter, and an output for providing an amplified copy of said input signal as an input to electromechanical conversion means, and (b) electromechanical conversion means with an input connected to receive said output of said amplifying means, and an output for providing mechanical displacement.

17. A system as claimed in claim 9 with the addition of an output converter comprising:

(a) amplifying means with an input connected to receive as an input signal the analog output of the digital-to-analog converter, and an output for providing an amplified copy of said input signal as an input to electromechanical conversion means, and (b) electromechanical conversion means with an input connected to receive said output of said amplifying means, and an output for providing mechanical displacement.

18. A system as claimed in claim 1 wherein the analog-to-digital conversion means include at least one device selected from the set consisting of digital shaft encoders, flash converters, successive approximation converters, and slope converters.

19. A system as claimed in claim 1 wherein the analog input is displacement of one mechanical member and the analog output is coupled through amplifying means to a motor that drives a second mechanical member in response to the analog output of the digital-to-analog conversion means.

* * * * *